United States Patent [19]
Lee et al.

[11] Patent Number: 5,761,138
[45] Date of Patent: Jun. 2, 1998

[54] MEMORY DEVICES HAVING A FLEXIBLE REDUNDANT BLOCK ARCHITECTURE

[75] Inventors: Kyu-Chan Lee, Seoul; Keum-Yong Kim, Kyungki-do, both of Rep. of Korea

[73] Assignee: Samsung Electronics Co., Ltd., Suwon, Rep. of Korea

[21] Appl. No.: 754,673

[22] Filed: Nov. 21, 1996

[30] Foreign Application Priority Data

Nov. 22, 1995 [KR] Rep. of Korea ............ 42985/1995

[51] Int. Cl.$^6$ .................. G11C 7/00; G11C 8/00
[52] U.S. Cl. .......... 365/200; 365/230.03; 365/189.08; 365/225.7
[58] Field of Search ............ 365/200, 230.02, 365/230.03, 189.02, 189.08, 225.7

[56] References Cited

U.S. PATENT DOCUMENTS 4,807,191  2/1989  Flannagan .................. 365/200
5,045,720  9/1991  Bae .......................... 365/230.06

Primary Examiner—David C. Nelms
Assistant Examiner—Trong Phan
Attorney, Agent, or Firm—Myers Bigel Sibley & Sajovec

[57] ABSTRACT

A memory device includes a plurality of data input/output (I/O) lines and means for receiving a column address. The memory device also includes a plurality of primary memory cells, a selected primary memory cell of the plurality of primary memory cells being connected to a primary global I/O line in response to receipt of one column address, and a plurality of redundant memory cells, a selected redundant memory cell of the plurality of redundant memory cells being connected to a redundant global I/O line in response to receipt of the one column address. One of the primary global I/O line and the redundant global I/O line are selectively connected to one of the plurality of data I/O lines such that one of the selected primary memory cell and the selected redundant memory cell is connected to the one data I/O line to thereby enable data transfer therebetween, preferably by enabling one of a primary I/O sense amplifier and a redundant I/O sense amplifier connected to the primary and redundant global I/O lines, respectively.

12 Claims, 7 Drawing Sheets

MEMORY DEVICES HAVING A FLEXIBLE REDUNDANT BLOCK ARCHITECTURE

FIELD OF THE INVENTION

The present invention relates to microelectronic devices, more particularly, to memory devices.

BACKGROUND OF THE INVENTION

As memory devices become more highly integrated, including an increasing number of memory cells and associated circuitry, the probability of a given device including one or more defective cells and/or associated circuitry generally has increased. Because of this increased likelihood, it has become desirable to use redundant structures to allow devices with failed cells or other circuits to be utilized. Conventional techniques typically involve replacing a primary memory array having a failed cell with a spare array and/or replacing a failed bit line associated with a failed cell with a corresponding spare bit line in a spare array. Unfortunately, replacing an entire array with a spare array can be inefficient, wasting precious space on the chip.

A conventional redundant memory architecture is described in U.S. Pat. No. 5,045,720 to Bae. FIG. 1 is illustrative of this architecture, showing a spare column selection circuit 100 in which a line switch pair 10a, 10b for a spare column selection is connected between normal input/output (I/O) lines 5 coupled to normal bit line pairs 6, and spare I/O lines 4 coupled to spare bit line pairs 3. The line switch pair 10a, 10b is responsive to a clock pulse φD output from a spare column decoder 1. A normal I/O line pull-up pair 20a, 20b connected between the normal I/O lines 5 and a power supply voltage Vcc is driven in response to the inactivation of the clock pulse φD. An inverter 11 connected to the output node of the spare column decoder 1 outputs a clock pulse φSCD which has an inverted phase with respect to the clock pulse φD. This clock pulse φSCD drives NMOS transistors MS1–MS4, the channels of which are connected between the spare I/O lines 4 and the spare bit line pairs 3, thereby connecting the spare I/O lines 4 to the spare bit line pairs 3.

To access the normal bit line pairs 6, upon assertion of a row address strobe signal RASB and a column address strobe signal CASB to logic "low" levels, an externally applied row address and column address are latched and a clock pulse φY is then generated, completing an operation of sensing a potential between the normal bit line pairs 6, as is commonly performed in memory devices and well known to those skilled in the art. Sensed data on the normal bit line pairs 6 is then transferred to the line switch pairs 10a,10b via the NMOS transistors MN1–MN4, which are turned on in response to assertion of a clock pulse φNCD output from a normal column decoder 11.

The clock pulse φD output from the spare column decoder 1 remains at a logic "high," thus maintaining the line switch pairs 10a,10b in an "on" state, and allowing the data to be transferred to the I/O lines 4.

As illustrated in FIG. 2, to access the spare bit line pairs 3, the clock signal φD output from the spare column decoder 1 is taken to a logic "low," thus turning off the line switch pairs 10a–10b. Thus, the normal bit line pairs 6 are isolated from the normal I/O lines 5. The inverted clock signal φSCD output from the inverter 11 goes to a logic "high" level, turning on the NMOS transistors MS1–MS4, allowing data on the pare bit line pairs 3 to be transferred to the spare I/O lines 4. Typically, the operation of the spare column decoder 1 and the normal column decoder 11 is controlled by fuses or other programmable elements. Because the decoding operations in the spare column decoder 1 and the normal column decoder 11 can occur in parallel, loss in speed in using the spare decoder 1 and associated structures can be reduced. In addition, during the read mode of the device, the spare bit line pair 3 and the normal bit line pair 6 can be isolated, providing for a reduced loading effect and enabling high speed operation. However, the flexibility of the redundancy offered by this and similar conventional techniques may be limited due to the shared path between the normal I/O lines 5 and the spare I/O lines 4.

SUMMARY OF THE INVENTION

In light of the foregoing, it is an object of the present invention to provide memory devices which offer greater flexibility in providing redundant memory capacity.

This and other objects, features and advantages are provided according to the present invention by memory devices including a plurality of blocks of primary cells which are selectively connected to a corresponding plurality of primary input/output (I/O) sense amplifiers which drive a data I/O bus, and a plurality of blocks of redundant memory cells which are selectively connected to a plurality of blocks of redundant I/O sense amplifiers connected to the data I/O, and in which the primary I/O sense amplifiers and the redundant I/O sense amplifiers are selectively enabled according to a received column address and a predetermined mapping. The mapping allows substitution of a redundant memory cell from any of the blocks of redundant memory cells, and its associated data path, to substitute for a defective primary memory cell in any one of the blocks of primary memory cells. Memory devices with a flexible, redundant block architecture are thereby provided.

In particular, according to the present invention, a memory device includes a plurality of data input/output (I/O) lines and means for receiving a column address. The memory device also includes a plurality of primary memory cells, a selected primary memory cell of the plurality of primary memory cells being connected to a primary global I/O line in response to receipt of one column address, and a plurality of redundant memory cells, a selected redundant memory cell of the plurality of redundant memory cells being connected to a redundant global I/O line in response to receipt of the one column address. Means selectively connecting one of the primary global I/O line and the redundant global I/O line to one of the plurality of data I/O lines such that one of the selected primary memory cell and the selected redundant memory cell is connected to the one data I/O line to thereby enable data transfer therebetween.

The means for selectively connecting preferably include a primary I/O sense amplifier connected to the primary global I/O line and one of the data I/O lines, the primary I/O sense amplifier having an enabled state and a disabled state, the primary I/O sense amplifier connecting the connected primary global I/O line and the connected data I/O line in the enabled state to thereby enable data transfer therebetween, the primary I/O sense amplifier disconnecting the connected global I/O line and the connected data I/O line in the disabled state to thereby disable data transfer therebetween. The means for selectively connecting also preferably includes a redundant I/O sense amplifier connected to the redundant global I/O line and one of the data I/O lines, the redundant I/O sense amplifier having an enabled state and a disabled state, the redundant I/O sense amplifier connecting the connected redundant global line and the connected data I/O line in the enabled state to thereby enable data transfer therebetween, the redundant I/O sense amplifier disconnecting the connected global I/O line and the connected data I/O line in the disabled state to thereby disable data transfer therebetween. Means store a predetermined mapping of the redundant memory cell and the primary memory cell to the one column address, and means, responsive to the means for receiving a column address and the means for storing a predetermined mapping, selectively enable one of the primary I/O sense amplifier and the redundant I/O sense amplifier in response to the received column address and the stored predetermined mapping.

The primary I/O sense amplifier preferably includes means for receiving a primary I/O sense amplifier output enable signal, the primary I/O sense amplifier being responsive to the primary I/O sense amplifier output enable signal to enable the primary I/O sense amplifier when the primary I/O sense amplifier output enable signal has a first value and to disable the primary I/O sense amplifier when the primary I/O sense amplifier output enable signal has a second value. The redundant I/O sense amplifier preferably includes means for receiving a redundant I/O sense amplifier output enable signal, the redundant I/O sense amplifier being responsive to enable the redundant I/O sense amplifier when the redundant I/O sense amplifier output enable signal has a first value and to disable the redundant I/O sense amplifier when the redundant I/O sense amplifier output enable signal has a second value. The means for selectively enabling preferably includes means, responsive to the means for receiving a column address and the means for storing a predetermined mapping, for generating a primary block select signal and a redundant block select signal from the received column address and the stored predetermined mapping, means, responsive to the means for receiving a column address and the means for generating primary and redundant block select signals, for generating the primary I/O sense amplifier output enable signal according to the received column address signal and the primary block select signal, and means, responsive to the means for receiving a column address and the means for generating primary and redundant block select signals, for generating the redundant I/O sense amplifier output enable signal according to the received column address signal and the redundant block select signal. The primary block select signal and the redundant block select signal are complementary to one another such that one of the primary I/O sense amplifier and the redundant I/O sense amplifier is enabled for the received column address.

The means for generating primary and redundant block select signals preferably includes means for storing a predetermined column select mapping which maps the selected primary cell and the selected redundant memory cell to the one column address, as well as means, responsive to the means for receiving a column address and the means for storing a predetermined column select mapping, for generating a primary column select signal having one of an enabled value and a disabled value and a redundant column select signal having one of an enabled value and a disabled value, according to the received column address and the stored predetermined column select mapping. The means for generating primary and redundant block select signals also includes means for storing a predetermined block select mapping, and means, responsive to the means for receiving a column address, to the means for generating primary and redundant column select signals and to the means for storing a predetermined block select mapping, for generating the primary block select signal and the redundant block select signal according to the received column address, the values of the primary and redundant column select signals, and the stored predetermined block select mapping. The means for storing a predetermined column select mapping preferably includes a plurality of fuses which program the means for storing a predetermined column select mapping to produce predetermined values for the primary and redundant column select signals from the received column address. The means for storing a predetermined block select mapping preferably includes a plurality of fuses which program the means for storing a predetermined block select mapping to produce predetermined values for the primary and redundant block select signals from the received column address and the redundant column select signal.

According to a preferred embodiment, a memory device includes means for receiving a column address, and means, responsive to the means for receiving a column address, for generating a plurality of primary column select signals and a plurality of redundant column select signals in response to the received address, each of the primary column select signals having one of a enabled and a disabled value, each of the redundant column select signals having one of an enabled and a disabled value, such that one of the primary column select and one of the redundant column select signals is enabled for each block for a received address. The memory device also includes a data input/output (I/O) bus including a plurality of data I/O lines, a plurality of blocks of primary memory cells, and a plurality of blocks of redundant memory cells. The memory device also includes plurality of blocks of primary I/O sense amplifiers, a respective one of the plurality of blocks of primary I/O sense amplifiers being connected to a respective one of the data I/O lines, memory cells of a respective one of the plurality of blocks of primary memory cells being selectively connected to I/O sense amplifiers of a respective one of the plurality of primary I/O sense amplifiers according to the values of the primary column select signals, and a plurality of blocks of redundant I/O sense amplifiers, a respective one of the redundant I/O sense amplifiers of plurality of blocks of redundant I/O sense amplifiers connected to a respective one of the data I/O lines, memory cells of a respective one of the plurality of blocks of redundant memory cells being selectively connected to redundant I/O sense amplifier of a respective one of the plurality of blocks of redundant I/O sense amplifiers according to the values of the redundant column select signals. Means, responsive to the means for generating the primary column select signals and the redundant column select signals and to the means for receiving a column address, selectively enable one I/O sense amplifier of one of the plurality of blocks of I/O sense amplifiers and the plurality of blocks of redundant I/O sense amplifiers according to the received column address and the values of the primary column select and redundant column select signals, to thereby transfer data between the data I/O line and the memory cell connected to the enabled sense amplifier.

The means for generating a column select signal and a redundant column select signal preferably includes a programmable column select signal generator programmable to produce one column select signal having an enabled value in response to receipt of a first column address and to produce one redundant column select signal having an enabled value in response to receipt of a second column address. The programmable column select signal generator preferably includes fuses operable to program the programmable column select signal generator to produce predetermined values for the primary and redundant column select signals from a received address.

The means for selectively enabling preferably includes a plurality of primary block I/O controllers, a respective one of the plurality of primary block I/O controllers controlling a respective one of the blocks of I/O sense amplifiers, each primary block I/O controller responsive to the received column address and including means for receiving an individual associated block select signal having one of a first value and a second value, the primary I/O block controller disabling the primary I/O sense amplifiers in the associated block of primary I/O sense amplifiers when the associated primary block select signal has the second value and the primary I/O block controller selectively enabling one of the primary I/O sense amplifiers in the associated block of primary I/O sense amplifiers according to the received column address when the associated primary block select signal has the first value. The means for selectively enabling also preferably includes a plurality of redundant block I/O controllers, a respective one of the plurality of redundant block I/O controllers controlling a group of the plurality of blocks of redundant I/O sense amplifiers, each individual redundant block I/O controller responsive to the received column address and including means for receiving a common plurality of redundant block 110 select signals, each of the redundant block I/O signals having one of a first value and a second value, the redundant block I/O controller disabling all of the associated group of blocks of redundant I/O sense amplifiers when all of the common plurality of redundant block I/O select signals have the second value, the redundant block I/O controller selectively enabling one redundant I/O sense amplifier of one block of the associated group of blocks of redundant I/O sense amplifiers according to the received address and the common plurality of redundant block I/O select signals when one of the redundant block I/O select signals has the first value.

A programmable block select signal generator is responsive to the column select signal generator and programmable to produce the second value for one of the primary block select signals and to produce the first value for a redundant block select signal of the common plurality of redundant block select signals when one of the redundant column select signals has the first value. The programmable block select signal generator preferably includes fuses operable to program the programmable block select signal generator to produce predetermined values for the primary block select signals and the redundant block select signals in response to the redundant column select signals.

The memory device may further include a plurality of split word line drivers disposed in row and column directions, a plurality of primary sense amplifier blocks disposed in the row and column directions, and a plurality of redundant sense amplifier blocks disposed in the row and column directions, a respective one of the redundant sense amplifier blocks being disposed adjacent a respective one of the primary sense amplifier blocks in the row direction. A plurality of primary global I/O lines extend in the column direction, overlying a first group of the split word line drivers and connected to the primary I/O sense amplifiers, while a plurality of redundant global I/O lines extend in the column direction, overlying a second group of the split word line drivers and connected to the redundant I/O sense amplifiers. A plurality of primary sub I/O lines extend in the row direction, overlying the primary sense amplifier blocks, which are switchably connected to the primary global I/O lines and to primary memory cells in an adjacent primary memory cell array, and a plurality of redundant sub I/O lines extend in the row direction, overlying the redundant sense amplifier blocks, which are switchably connected to the redundant global I/O lines and to redundant memory cells in an adjacent redundant memory cell array. Each block of primary memory cells is arranged as a plurality of primary memory cell arrays, a respective one the plurality of primary memory cell arrays being disposed between a respective pair of the split word line drivers in the row direction and between a respective pair of the sense amplifier blocks in the column direction, and each block of redundant memory cells is arranged as a plurality of redundant memory cell arrays, a respective one of the redundant memory cell arrays being disposed between a respective one of the primary memory cell arrays and a respective one of the split word line drivers in the row direction and between a respective pair of the redundant sense amplifier blocks in the column direction. A flexible redundant memory architecture is thereby provided.

BRIEF DESCRIPTION OF THE DRAWINGS

Some of the objects and advantages of the present invention having been stated, others will be more fully understood from the detailed description that follows and by reference to the accompanying drawings in which.

DETAILED DESCRIPTION OF PREFERRED EMBODIMENTS

Figure 1:
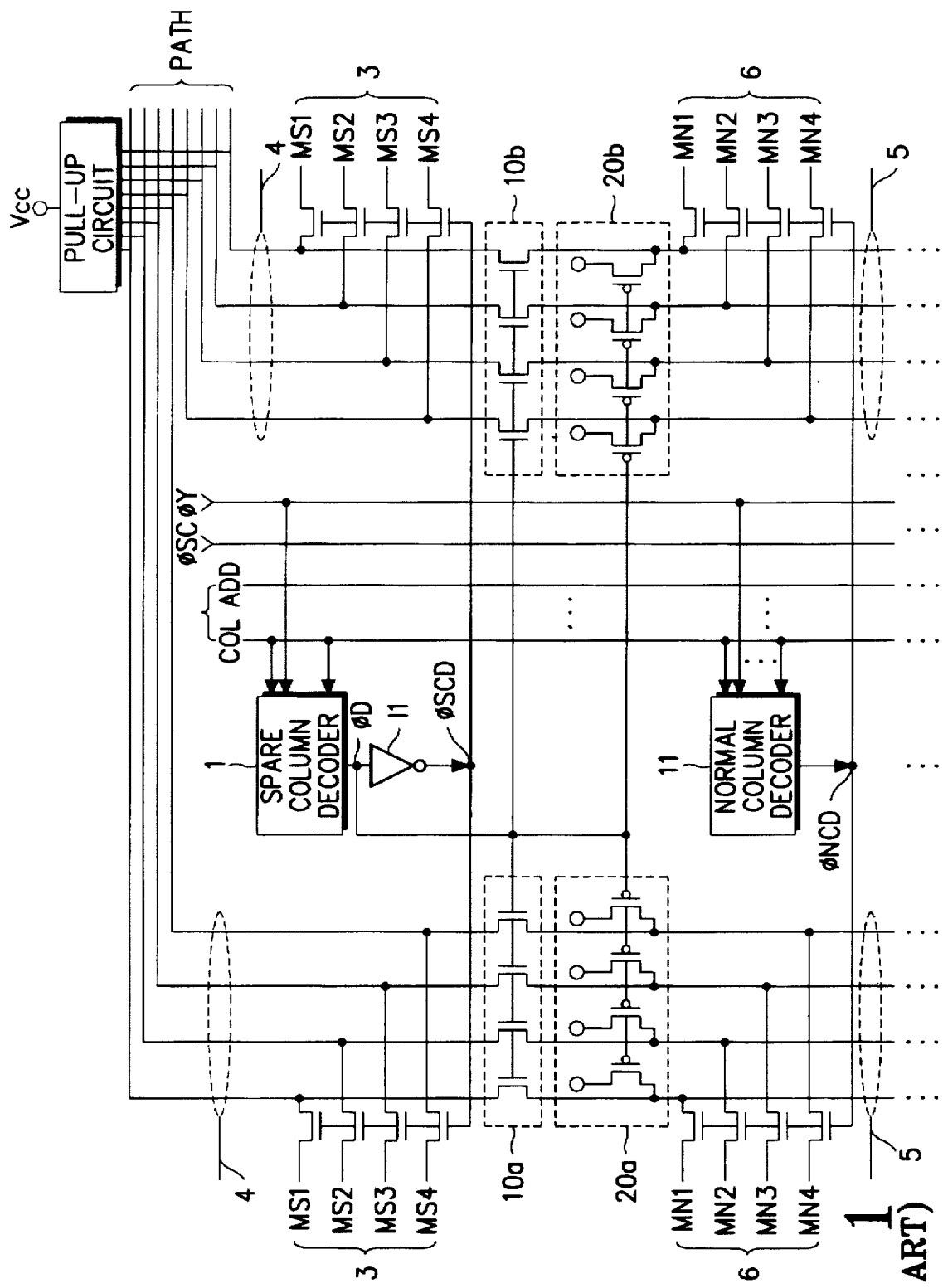
FIG. 1 is a schematic block diagram illustrating a redundant memory architecture according to the prior art.
Figure 2:
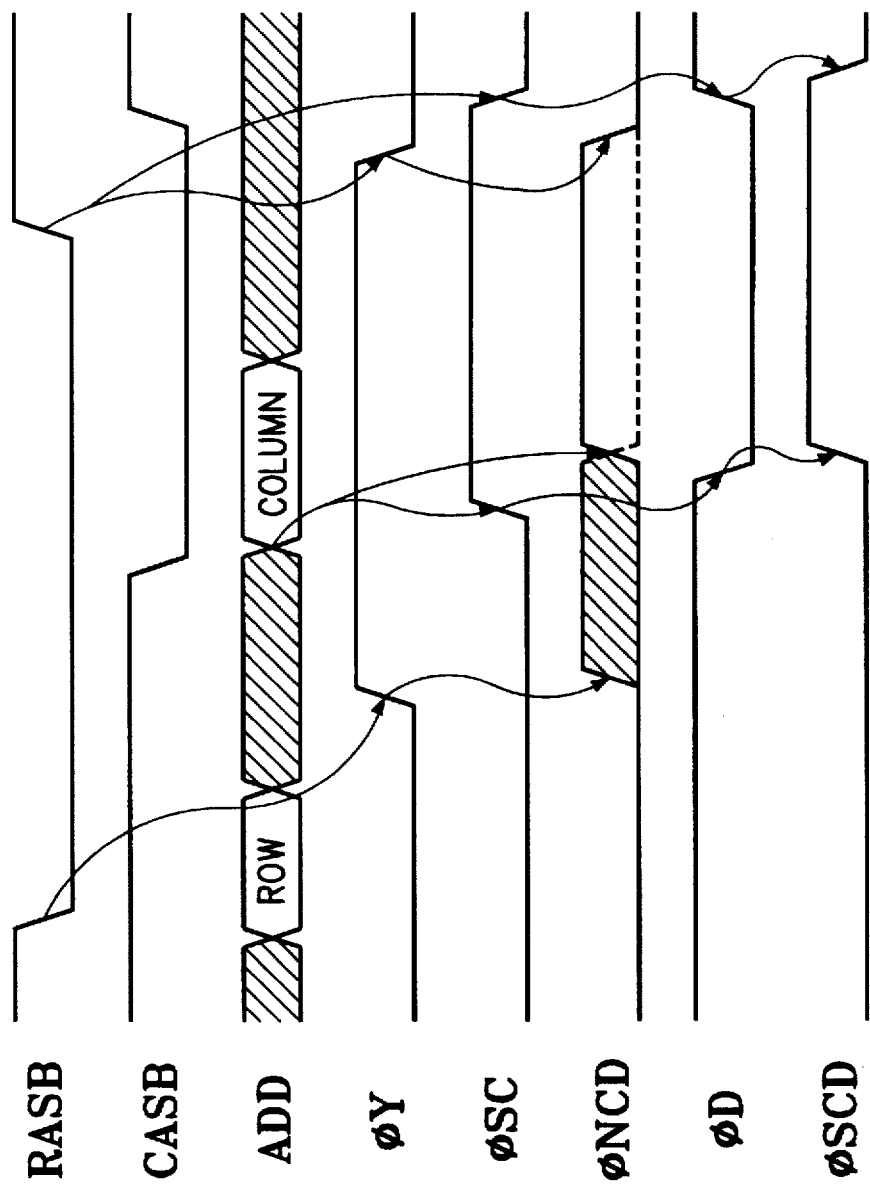
FIG. 2 is a timing diagram illustrating operation of a redundant memory architecture according to the prior art.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the sizes of regions are exaggerated for clarity, and like numbers refer to like elements throughout.

Figure 3A:
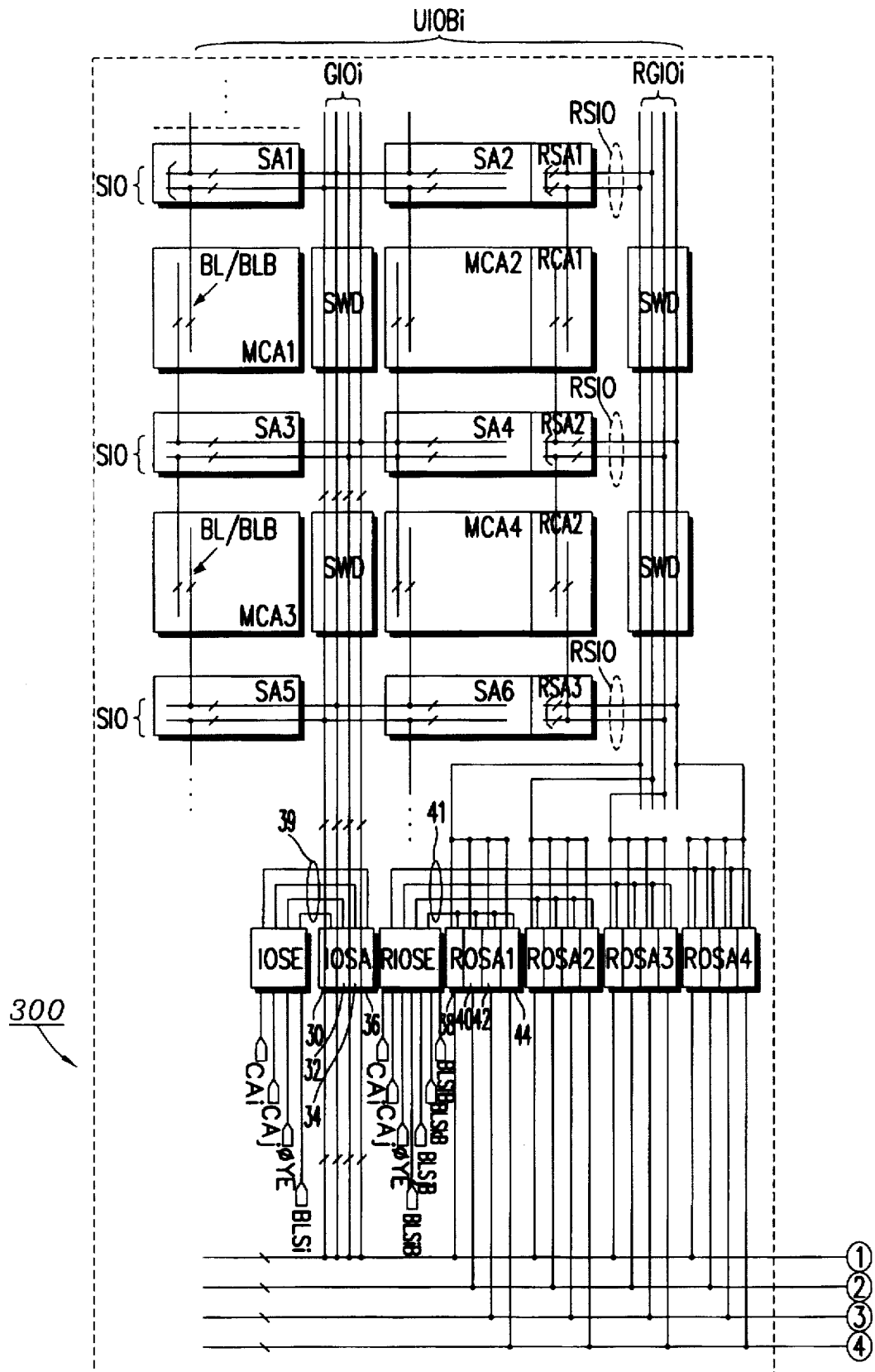
FIGS. 3A–3B are schematic block diagrams illustrating a memory device having a flexible redundant architecture according to the present invention.
Figure 3B:
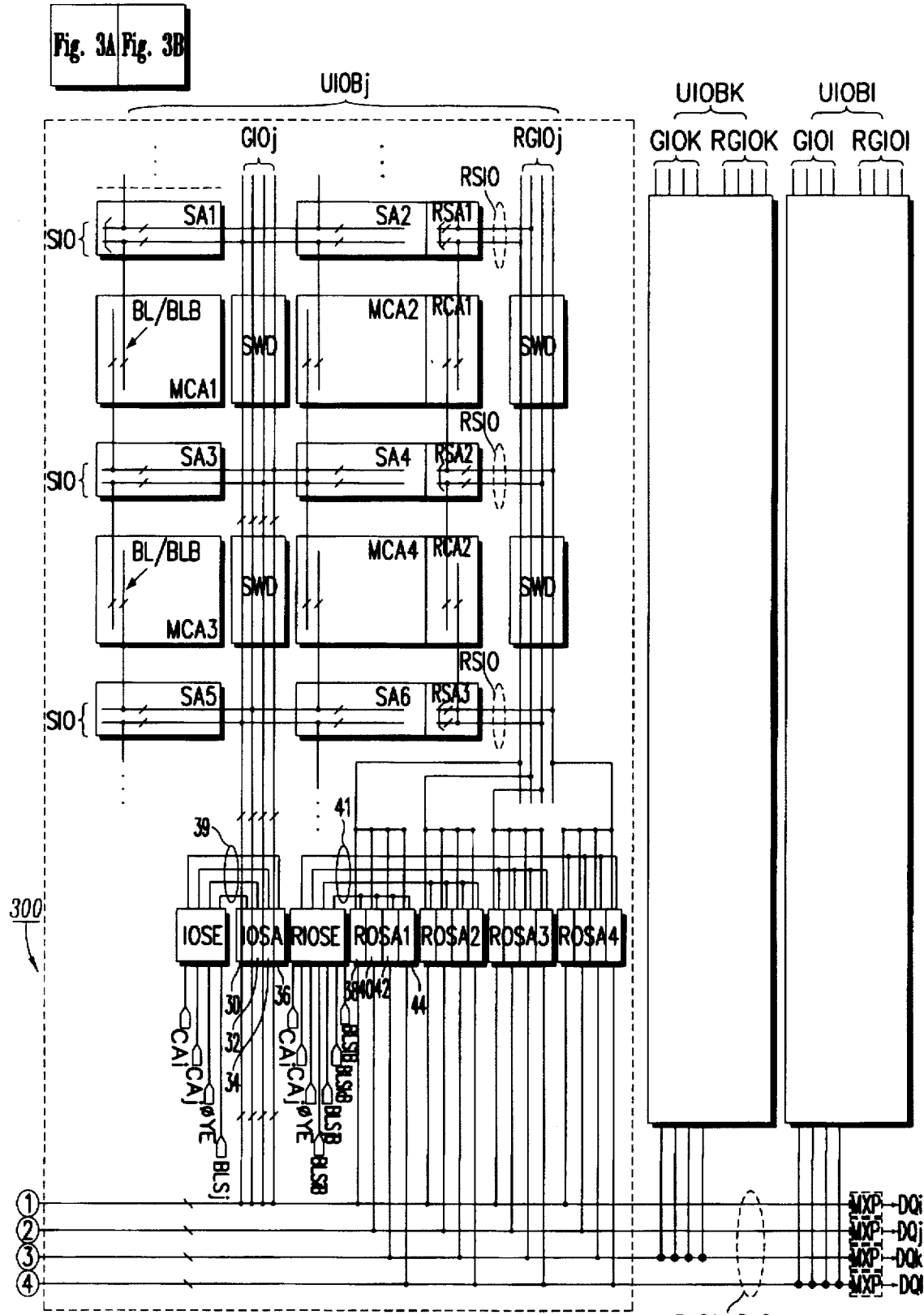

FIGS. 3A and 3B are schematic diagrams illustrating a memory device 300 according to the present invention having a flexible, redundant block architecture. In the figure, each of the I/O unit blocks UIOBi, UIOBj, UIOBk, UIOBl input/output data via corresponding data I/O terminals DQi, DQj, DQk, DQl has a primary I/O path and a redundant I/O path which are independent of one another. Referring to FIG. 3A, primary global I/O lines GIOi, GIOj, GIOk, GIOl are connected to data I/O lines DIOi, DIOj, DIOk DIOl via primary I/O sense amplifier blocks IOSA. Each of the blocks of primary I/O sense amplifiers IOSA is shown as including four primary I/O sense amplifiers 30, 32, 34, 36. The data I/O lines DIOi, DIOj, DIOk, DIOl are shown as being connected to data I/O terminals DQi, DQj, DQk, DQl via multiplexers/amplifiers MXP. The redundant global I/O paths RGIOi, RGIOj, RGIOk, RGIOl are connected to redundancy I/O sense amplifier blocks RIOSA1–4, each of which is shown including four redundant I/O sense amplifiers 38, 40, 42, 44. The redundant I/O sense amplifiers are connected to the data I/O lines DIOi, DIOj, DIOk, DIOl, respectively. As shown, each of the normal global I/O line GIOi, GIOj, GIOk, GIOl and redundancy global I/O paths RGIOi, RGIOj, RGIOk and RGIOl may include a line pair.

Although four-wide data paths are illustrate in FIGS. 3A–B, those skilled in the art will appreciate that global I/O busses, redundant I/O busses and data I/O busses having fewer or greater numbers of individual lines may also be used with the present invention.

The memory device 300 as illustrated in FIGS. 3A and 3B includes a block architecture including unit I/O blocks UIOBi–l, each of which include a block of primary memory cells in primary memory cell arrays MCA1–4 and a block of redundant memory cells in redundant memory cell arrays RCA1–2. Each unit I/O block UIOBi–l has a hierarchical structure of data paths, with a primary path including primary sub I/O bus SIO and primary global I/O bus GIOi connected to the block of primary memory cells in primary memory cell arrays MCA1–4, and a redundant I/O path including redundant sub I/O bus RSIO and redundant global I/O bus RGIOi connected to the block of redundant memory cells in redundant memory cell arrays RCA1–2, with the redundant path being independent of the primary path.

The primary global I/O bus GIOi preferably is formed overlying a split word line driver SWD positioned between the primary memory cell arrays MCA1–4 as shown. The redundant global I/O bus RGIOi may be formed overlying split word line drivers SWD positioned between the redundant memory cell array RCA1 and the primary memory cell array MCA1 in the adjacent I/O unit block UIOBj, and between the redundant memory cell array RCA2 and the normal memory cell array MCA3 in the adjacent I/O unit block UIOBj. In each of the I/O unit blocks UIOBi, UIOBj, UIOBk and UIOBl, the primary sub I/O lines SIOi–l preferably are formed overlying primary sense amplifier blocks SA1–6 and redundant sub I/O lines RSIOi–l are formed overlying redundant sense amplifier blocks RSA. Using this preferred layout, different paths may be provided for primary and redundant operations, help to reduce parasitic bit line loading and increasing the flexibility of the architecture without an undesirable increase in size of the cell array.

For purposes of explanation, the following description of elements of each of the unit I/O blocks UIOBi–l will describe one of the unit I/O blocks UIOBi. Those skilled in the art will understand, however, that the unit I/O blocks UIOBi–l generally have identical structures, and thus the following description will pertain to all of the unit I/O blocks UIOBi–l.

The split word line drivers SWD, for example, conventional word line drivers, preferably are in a row direction between the primary memory cell arrays MCA1,MCA2, between the primary memory cell arrays MCA3,MCA4, between the redundant memory cell array RCA1 and the primary memory cell array MCA1 within the adjacent I/O unit block UIOBj and between the redundant memory cell array RCA2 and the primary memory cell array MCA3 within the adjacent I/O unit block UIOBj. Primary sense amplifier blocks SA3, SA4 are arranged in a column direction, i.e., in the bit line direction, between the primary memory cell arrays MCA1, MCA3 and between the primary memory cell arrays MCA2, MCA4. Redundant sense amplifier blocks RSA2 is arranged between the redundant memory cell arrays RCA1, RCA2. Each of the primary memory cell arrays MCA1, MCA3 are preferably isolated as shown, while each of the primary memory cell arrays MCA2, MCA4 are preferably formed adjacent to the redundant memory cell arrays RCA1, RCA2.

The primary sub I/O bus SIO, preferably formed overlying the primary sense amplifier blocks SA1–SA6, serves as a path for transferring data in the primary memory cells of the primary memory cell arrays MCA1–4 to the normal global I/O bus GIOi. The redundant sub I/O bus RSIO, preferably formed overlying the redundant sense amplifier block RSA2, serves as a path for transferring the redundancy cell data to the redundant global I/O bus RGIOi. The primary global I/O bus GIOi is connected to the primary I/O sense amplifier block IOSA, and the primary sense amplifiers 30,32,34,36 of the primary I/O sense amplifier block IOSA are selectively connected to a data I/O line DIOi to enable data transfer from primary memory cells of the block of primary memory cells in the unit I/O block UIOBi to the data I/O terminal Dqi. The primary I/O sense amplifiers 30, 32, 34, 36 within the primary I/O sense amplifier block IOSA are independently enabled by primary I/O sense amplifier output enable signals 39. Means for generating a primary I/O sense amplifier output enable signal 39 may include a primary block I/O controller IOSE that generates the primary I/O sense amplifier output enable signal 39 from a column address CAi–CAj, a column address enable signal φYE and a primary block select signal BLSi.

Preferably, the number of the line pairs of the redundant global data I/O bus RGIOi corresponds to the number of I/O unit blocks UIOBi–j. For example, for the illustrated embodiment of FIGS. 3A–B, four I/O unit blocks and four pairs of redundant global data I/O lines are provided for the redundant global I/O bus RGIOi. The redundant global data I/O line of the bus RGIOi are connected to redundant I/O sense amplifier blocks ROSA1–4. As illustrated, each of the redundant I/O sense amplifier blocks ROSA1–4 includes four redundant I/O sense amplifiers 38, 40, 42, 44 which are respectively connected to data I/O lines DIOi, DIOj, DIOk, DIOl. The redundant I/O sense amplifier blocks ROSA1–4 are selectively enabled by redundant I/O sense amplifier output enable signals 41. Means for generating a redundant I/O sense amplifier output enable signal 41 may include a redundant block I/O controller RIOSE that generates the redundant I/O sense amplifier output enable signal 41 from the column address CAi, CAj, the column address enable signal φYE, and redundant block select signals BLSiB, BLSjB, BLSkB, BLSlB.

Figure 4:
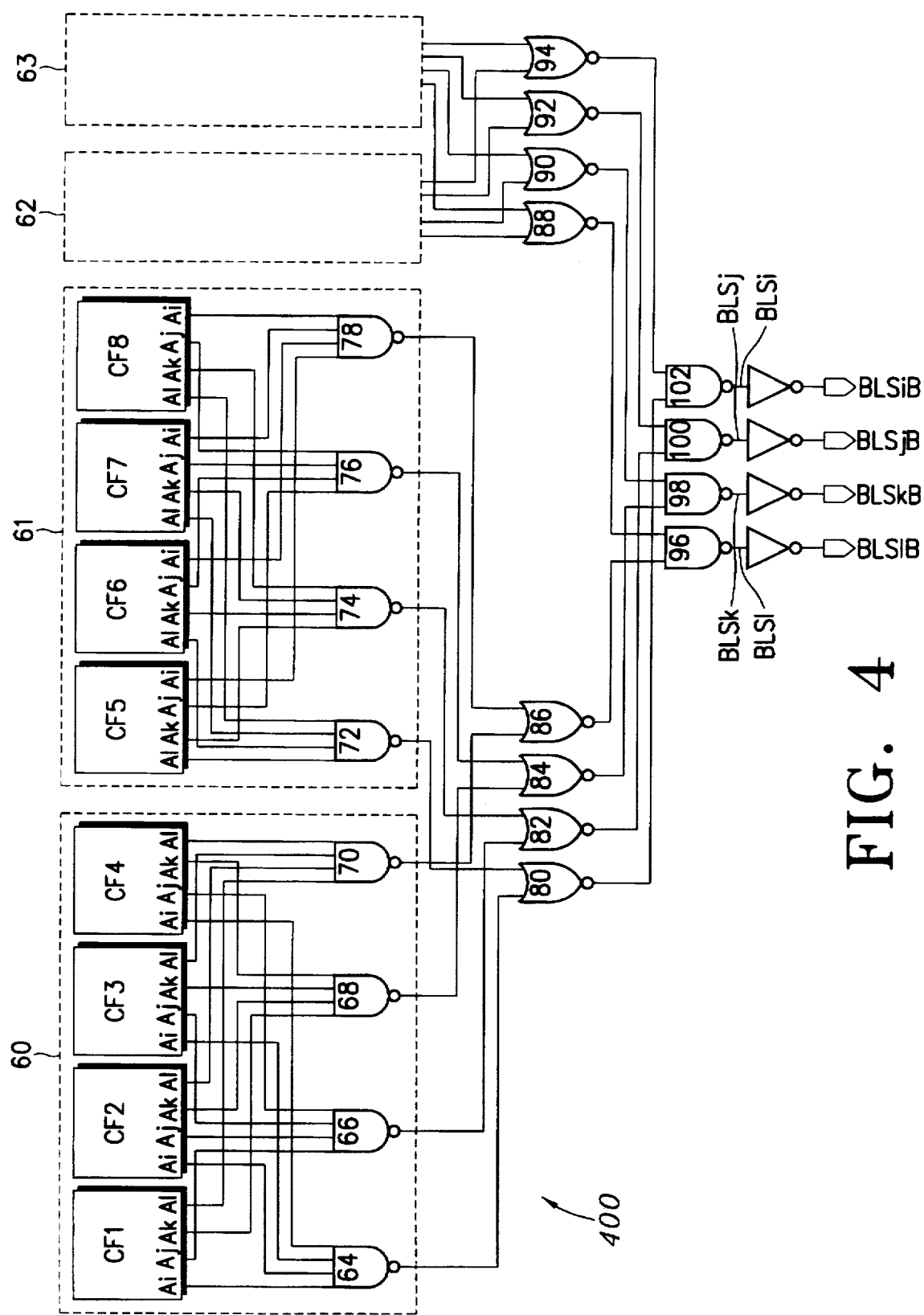
FIG. 4 is a schematic block diagram illustrating a programmable circuit for mapping primary memory cells and redundant memory cells to a column address according to the present invention.
Figure 5:
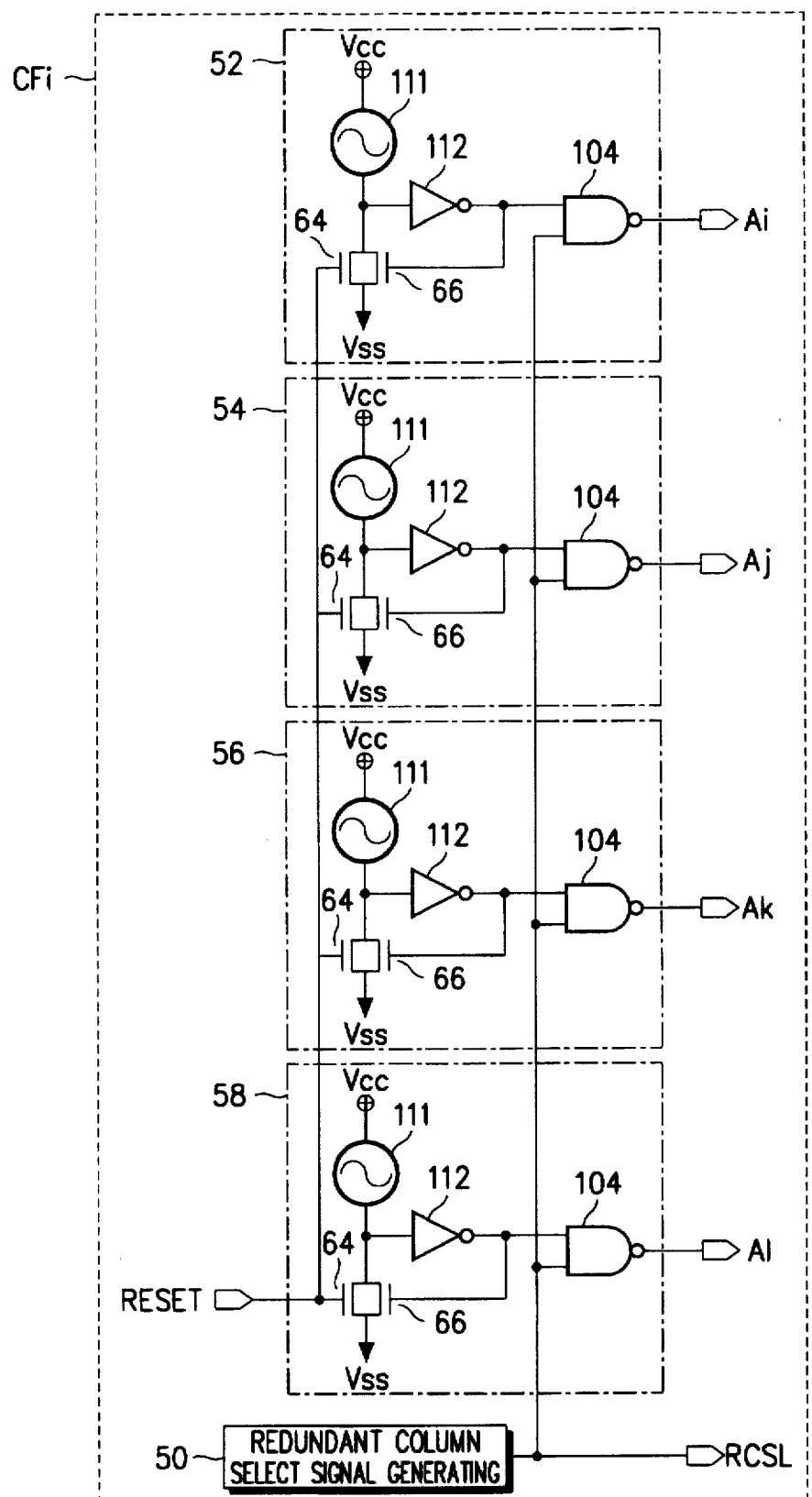
FIG. 5 is a schematic block diagram illustrating a fuse programmable circuit for programming redundant block selection according to the present invention.

FIGS. 4 and 5 illustrate circuits which provide means for storing a predetermined column select mapping, means for generating a primary column select signal having one of an enabled value and a disabled value and a redundant column select signal having one of an enabled value and a disabled value according to a received column address and a stored predetermined column select mapping, means for storing a predetermined block select mapping and means for generating the primary block select signals BLSi–BLSl and redundant block select signals BLSiB–BLSlB according to a received column address, the values of the primary and redundant column select signals, and the stored predetermined block select mapping. As illustrated in FIG. 4, means 400 for generating a primary block select signals BLSi--BLSl and for generating redundant block select signals BLSiB–BLSlB may include a circuit having column fuse circuits 60–63 which are programmable to produce predetermined values for primary block select signals BLSi–BLSl and redundant column select signals BLSiB–BLSlB for a given column address. A combinatorial logic circuit including a plurality of NAND gates 64, 66, 68, 70, 72, 74, 76, 78, 96, 98, 100, 102 and a plurality of NOR gates 80, 82, 84, 86, 88, 90, 92, 94 processes the outputs Ai–Aj of the column fuse circuits 60–63.

In this manner, the circuit 400 provides means for storing a block select mapping which maps redundant memory cells of the blocks of redundant memory cells in the arrays RCA1–2 in the unit I/O blocks UIOBi–1 to primary memory cells in the blocks of primary memory cells in the arrays MCA1–4 in the unit blocks UIOBi–1, through the action of the primary block select signals BLSi–BLSl and the redundant block select signals BLSiB–BLSlB.

As illustrated in FIG. 5, means for storing a column select mapping which maps redundant memory cell column addresses to primary memory cell column addresses may include means 50 for generating a redundant column select signal RCSL. The means 50 for generating the redundant column select signal RCSL preferably is a programmable column select signal generator programmable to produce the redundant column select signal in response to receipt of a given column address, for example, through fuse programming. The operation of such a signal generator is well known, and need not be discussed in detail herein.

A plurality of block selection fuses 52, 54, 56, 58 generate outputs Ai–Aj. Each of the fuse blocks 52, 54, 56, 58 preferably includes a fuse 111 connected to a power supply voltage Vcc and an inverter 112, the output of which is determined by the condition of the associated fuse 111. A reset capability may be provided using two NMOS transistors 64, 66 which have their channels connected between the input of the inverter 112 and a ground voltage Vss and gates receiving a reset signal RESET and the output of the inverter 112, respectively. At a respective one of the fuse blocks 52, 54, 56, 58, a NAND gate 104 combines the redundant column select signal RCSL and the output of the inverter 112 to produce respective outputs Ai–1.

Figure 6:
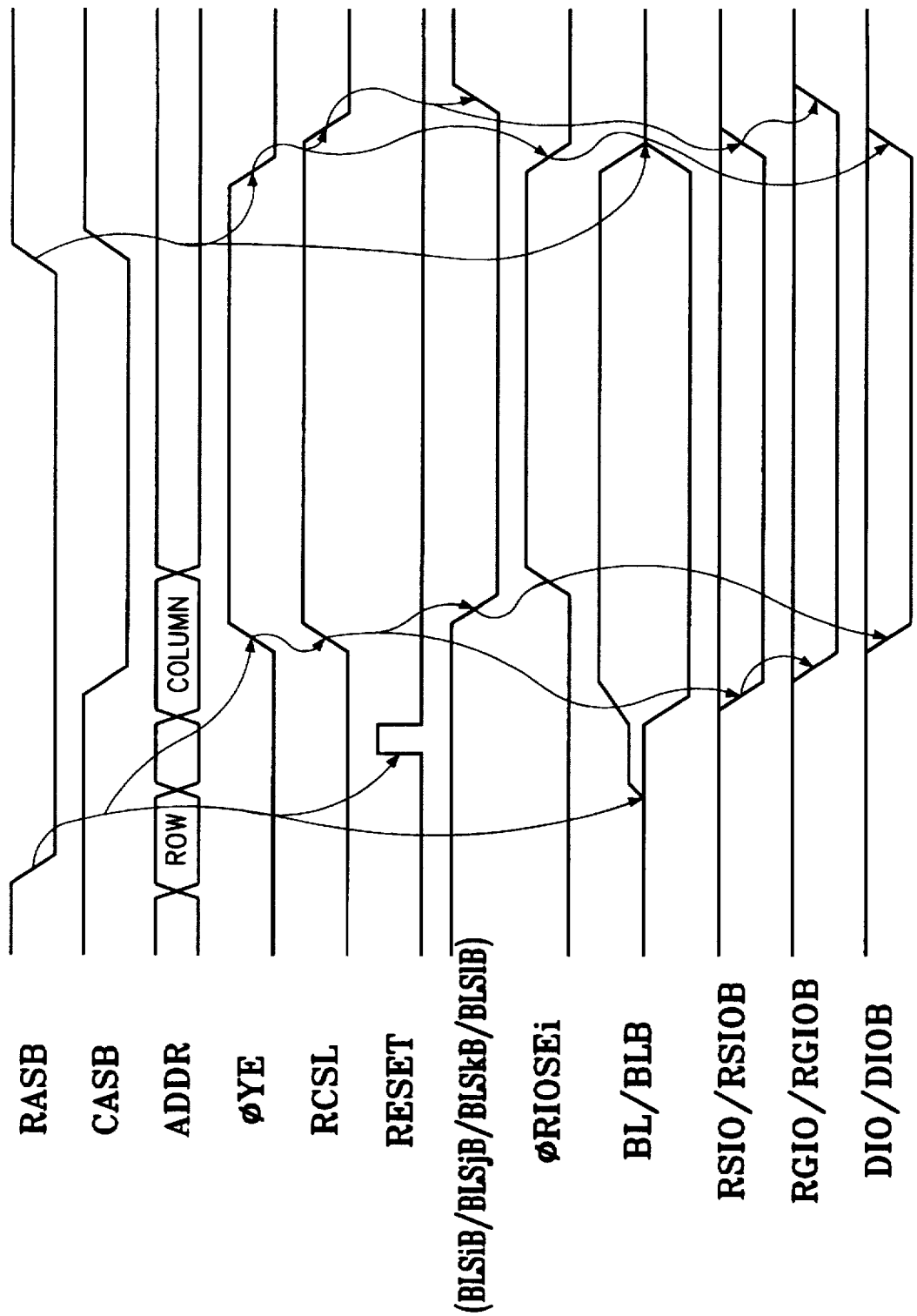
FIG. 6 is a timing diagram illustrating operations for accessing a redundant memory cell according to the present invention.

Operation of a memory device 300 of FIGS. 3A–B according to the present invention will now be explained in reference to FIGS. 4–6. The bit line pairs in the primary memory cell arrays MCA1–4 preferably have a folded sense amplifier configuration. Thus, one bit line pair BL/BLB of the primary memory cell array MCA1 is connected to the sense amplifier block SA1 and the adjacent bit line pair BL/BLB of the primary memory cell array MCA1 is connected to the sense amplifier block SA3. Similarly, one bit line pair BL/BLB of the primary memory cell array MCA3 is connected to the sense amplifier block SA3 and the adjacent bit line pair BL/BLB to the sense amplifier block SA5.

The potential levels of the bit line pairs BL/BLB connected to the primary memory cell arrays MCA1–4 are sensed and amplified by a plurality of sense amplifiers within the sense amplifier blocks SA1, SA3, SA5, which preferably are arranged in the column direction. The signals sensed and amplified by the sense amplifier blocks SA1, SA3, SA5 as described above are then transferred to the primary sub I/O bus SIO using, for example, column select transistors or pass transistors connected between the ends of the bit line pairs BL/BLB and the primary sub I/O lines SIO. The primary sub I/O bus SIO is connected to the primary global I/O bus GIOi using, for example, pass or transfer transistors controlled by a primary column select signal which is generated based on the column address. The primary global I/O lines of the primary global I/O bus GIOi are connected to the primary I/O sense amplifiers 30, 32, 34, 36 within the primary I/O sense amplifier block IOSA. The primary I/O sense amplifiers 30, 32, 34, 36 are selectively enabled by the primary block I/O controller IOSE, thus sensing and amplifying data on the primary global I/O data bus GIOi transferring the amplified data to the data I/O line DIOi.

The primary block I/O controller IOSE enables the primary I/O sense amplifiers in the primary I/O sense amplifier block IOSA responsive to the block select signal BLSi. If the block select signal BLSi has a logic "low" value, the primary block I/O controller IOSE selectively enables the primary I/O sense amplifiers 30, 32, 34, 36 according to the column address CAi–CAj. During "normal" conditions, e.g., when there are no failed primary cells or related data path components in any of the unit blocks UIOBi–1, the fuses 111 within the column fuse blocks Cfi of FIGS. 4 and 5 are left intact, thus producing logic "high" values for the redundant block select signals BLSiB–BLSlB, and logic "low" levels for the primary block select signals BLSi–BLSl, thus allowing selective enabling of the primary I/O sense amplifiers.

If a failed primary memory cell or associated data path component is present, the fuses in the column fuse blocks can be selectively opened to map a redundant memory cell to the column address used to access the failed primary memory cell. The primary column select signal preferably is disabled for the failed address and a redundant column select signal asserted instead using, for example, means 50 for generating a redundant column select signal RCSL as illustrated in FIG. 5. By opening selected fuses 111, a predetermined one of the primary I/O sense amplifier blocks IOSA can be disabled by sending the associated primary block select signal BLSi–1 to a logic "low" value, while a corresponding redundant memory cell is selectively enabled by action of the complementary redundant block select signal BLSiB–BLSlB.

The bit line pairs BL/BLB of the redundant memory cell array RCA1 also preferably have a folded sense amplifier configuration. The bit line pairs BL/BLB of the redundant memory cell arrays RCA1, RCA2 are sensed and amplified by the redundant sense amplifier blocks RSA1–3, which are connected to the redundant sub I/O bus RSIO using, for example, pass transistors or similar switching elements connected to the bit line pairs BL/BLB, which may be controlled by the redundant column selection line RCSL. The redundant sub I/O bus RSIO is connected to the redundant global I/O bus RGIOi using, for example, pass transistors or similar switching elements.

The redundant global I/O bus RGIOi is connected to the redundant I/O sense amplifier blocks ROSA1–4, which are in turn connected to the data I/O terminals DQi, DQj, DQk, DQl. The redundant I/O sense amplifier blocks ROSA1–4 are selectively enabled by redundant I/O sense amplifier output enable signals 41 generated by a redundant I/O block controller RIOSE, thereby enabling transfer of data between the redundant global I/O bus RGIOi and the data I/O terminals. The redundant block I/O controller RIOSE generates the redundant I/O sense amplifier output enable signals 41 from the column address CAi–CAj, the column address enable signal φYE, and the redundant block select signals BLSiB–BLSlB.

An exemplary redundant memory operation according to the present invention will now be discussed with reference to the timing diagram of FIG. 6. A memory cycle begins by asserting a row address strobe RASB and a column address strobe CASB by taking both signals to logic "low" values, in a technique commonly used in conventional memory devices. A reset signal RESET may be asserted to initialize the column fuse blocks of FIGS. 4 and 5. Row and column addresses are then latched, and the column address enable signal φYE is enabled, thereby completing the bit line voltage sensing operation on the bit line pairs BL/BLB. The redundant column select line RCSL then goes to a logic "high" in response to the column address. If the row address strobe RASB is enabled to the logic "low" level, there occurs a sensing operation at the bit line pairs BL/BLB and the reset pulse of logic "high" level is generated. The appropriate redundant block select line BLSiB–BLSlB is then taken to a logic "low" value. Data transfer to the redundant sub I/O bus RSIO and on to the redundant global I/O bus RGIOi is enabled by the redundant column select line RCSL. A predetermined redundant I/O sense amplifier is then enabled by action of the redundant block I/O controller RIOSE in response to the redundant block select signals BLSiB–BLSlB, thereby transferring the data to one of the data I/O lines DIOi, DIOj, DIOk, DIOl.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A memory device, comprising:
a plurality of data input/output (I/O) lines;
means for receiving a column address;
a plurality of primary memory cells, a selected primary memory cell of said plurality of primary memory cells being connected to a primary global I/O line in response to receipt of one column address;
a plurality of redundant memory cells, a selected redundant memory cell of said plurality of redundant memory cells being connected to a redundant global I/O line in response to receipt of said column address; and
means for selectively connecting one of said primary global I/O line and said redundant global I/O line to one of said plurality of data I/O lines such that one of said selected primary memory cell and said selected redundant memory cell is connected to said one data I/O line to thereby enable data transfer therebetween.

2. A memory device according to claim 1, wherein said means for selectively connecting comprises:
a primary I/O sense amplifier connected to the primary global I/O line and one of the data I/O lines, said primary I/O sense amplifier having an enabled state and a disabled state, said primary I/O sense amplifier connecting said connected primary global I/O line and said connected data I/O line in said enabled state to thereby enable data transfer therebetween, said primary I/O sense amplifier disconnecting said connected global I/O line and said connected data I/O line in said disabled state to thereby disable data transfer therebetween;
a redundant I/O sense amplifier connected to the redundant global I/O line and one of the data I/O lines, said redundant I/O sense amplifier having an enabled state and a disabled state, said redundant I/O sense amplifier connecting said connected redundant global line and said connected data I/O line in said enabled state to thereby enable data transfer therebetween, said redundant I/O sense amplifier disconnecting said connected global I/O line and said connected data I/O line in said disabled state to thereby disable data transfer therebetween;
means for storing a predetermined mapping of said redundant memory cell and said primary memory cell to said one column address; and
means, responsive to said means for receiving a column address and said means for storing a predetermined mapping, for selectively enabling one of said primary I/O sense amplifier and said redundant I/O sense amplifier in response to the received column address and said stored predetermined mapping.

3. A memory device according to claim 2:
wherein said primary I/O sense amplifier is responsive to a primary I/O sense amplifier output enable signal to enable said primary I/O sense amplifier when said primary I/O sense amplifier output enable signal has a first value and to disable said primary I/O sense amplifier when said primary I/O sense amplifier output enable signal has a second value;
wherein said redundant I/O sense amplifier is responsive to a redundant sense amplifier output enable signal to enable said redundant I/O sense amplifier when said redundant I/O sense amplifier output enable signal has a first value and to disable said redundant I/O sense amplifier when said redundant I/O sense amplifier output enable signal has a second value; and
wherein said means for selectively enabling comprises:
means, responsive to said means for receiving a column address and said means for storing a predetermined mapping, for generating a primary block select signal and a redundant block select signal from the received column address and the stored predetermined mapping;
means, responsive to said means for receiving a column address and said means for generating primary and redundant block select signals, for generating said primary I/O sense amplifier output enable signal according to the received column address signal and the primary block select signal; and
means, responsive to said means for receiving a column address and said means for generating primary and redundant block select signals, for generating said redundant I/O sense amplifier output enable signal according to the received column address signal and the redundant block select signal;
wherein said primary block select signal and said redundant block select signal are complementary to one another such that one of said primary I/O sense amplifier and said redundant I/O sense amplifier is enabled for the received column address.

4. A memory device according to claim 3 wherein said means for generating primary and redundant block select signals comprises:
means for storing a predetermined column select mapping which maps said selected primary cell and said selected redundant memory cell to said one column address;
means, responsive to said means for receiving a column address and said means for storing a predetermined column select mapping, for generating a primary column select signal having one of an enabled value and a disabled value and a redundant column select signal having one of an enabled value and a disabled value, according to the received column address and said stored predetermined column select mapping;
means for storing a predetermined block select mapping; and means, responsive to said means for receiving a column address, to said means for generating primary and redundant column select signals and to said means for storing a predetermined block select mapping, for generating said primary block select signal and said redundant block select signal according to the received column address, the values of said primary and redundant column select signals, and said stored predetermined block select mapping.

5. A memory device according to claim 4 wherein said means for storing a predetermined column select mapping comprises a plurality of fuses which program said means for storing a predetermined column select mapping to produce predetermined values for said primary and redundant column select signals from the received column address.

6. A memory device according to claim 4 wherein said means for storing a predetermined block select mapping comprises a plurality of fuses which program said means for storing a predetermined block select mapping to produce predetermined values for said primary and redundant block select signals from the received column address and the redundant column select signal.

7. A memory device, comprising:

means for receiving a column address;

means, responsive to said means for receiving a column address, for generating a plurality of primary column select signals and a plurality of redundant column select signals in response to the received address, each of said primary column select signals having one of a enabled and a disabled value, each of said redundant column select signals having one of an enabled and a disabled value, such that one of said primary column select and one of said redundant column select signals is enabled for each block for a received address;

a data input/output (I/O) bus including a plurality of data I/O lines;

a plurality of blocks of primary memory cells;

a plurality of blocks of primary I/O sense amplifiers, a respective one of said plurality of blocks of primary I/O sense amplifiers connected to a respective one of said data I/O lines, memory cells of a respective one of said plurality of blocks of primary memory cells being selectively connected to I/O sense amplifiers of a respective one of said plurality of primary I/O sense amplifiers according to said values of said primary column select signals;

a plurality of blocks of redundant memory cells;

a plurality of blocks of redundant I/O sense amplifiers, a respective one of said redundant I/O sense amplifiers of plurality of blocks of redundant I/O sense amplifiers connected to a respective one of said data I/O lines, memory cells of a respective one of said plurality of blocks of redundant memory cells being selectively connected to redundant I/O sense amplifier of a respective one of said plurality of blocks of redundant I/O sense amplifiers according to said values of said redundant column select signals;

means, responsive to said means for generating said primary column select signals and said redundant column select signals and to said means for receiving a column address, for selectively enabling one I/O sense amplifier of one of said plurality of blocks of I/O sense amplifiers and said plurality of blocks of redundant I/O sense amplifiers according to the received column address and the values of said primary column select and redundant column select signals, to thereby transfer data between the data I/O line and the memory cell connected to the enabled sense amplifier.

8. A memory device according to claim 7, wherein said means for generating a column select signal and a redundant column select signal comprises:

a programmable column select signal generator programmable to produce one column select signal having an enabled value in response to receipt of a first column address and to produce one redundant column select signal having an enabled value in response to receipt of a second column address.

9. A memory device according to claim 8 wherein said programmable column select signal generator comprises fuses operable to program said programmable column select signal generator to produce predetermined values for said primary and redundant column select signals from a received address.

10. A memory device according to claim 8, wherein said means for selectively enabling comprises:

a plurality of primary block I/O controllers, a respective one of said plurality of primary block I/O controllers controlling a respective one of said blocks of I/O sense amplifiers, each primary block I/O controller being responsive to the received column address and to an individual associated block select signal having one of a first value and a second value, said primary I/O block controller disabling the primary I/O sense amplifiers in the associated block of primary I/O sense amplifiers when the associated primary block select signal has the second value and said primary I/O block controller selectively enabling one of the primary I/O sense amplifiers in the associated block of primary I/O sense amplifiers according to the received column address when the associated primary block select signal has said first value;

a plurality of redundant block I/O controllers, a respective one of said plurality of redundant block I/O controllers controlling a group of said plurality of blocks of redundant I/O sense amplifiers, each individual redundant block I/O controller being responsive to the received column address and to a common plurality of redundant block I/O select signals, each of said redundant block I/O signals having one of a first value and a second value, said redundant block I/O controller disabling all of the associated group of blocks of redundant I/O sense amplifiers when all of said common plurality of redundant block I/O select signals have said second value, said redundant block I/O controller selectively enabling one redundant I/O sense amplifier of one block of the associated group of blocks of redundant I/O sense amplifiers according to the received address and the common plurality of redundant block I/O select signals when one of the redundant block I/O select signals has said first value; and a programmable block select signal generator responsive to said column select signal generator and programmable to produce said second value for one of said primary block select signals and to produce said first value for a redundant block select signal of said common plurality of redundant block select signals when one of said redundant column select signals has said first value.

11. A memory device according to claim 10, wherein said programmable block select signal generator comprises fuses operable to program said programmable block select signal generator to produce predetermined values for said primary block select signals and said redundant block select signals in response to said redundant column select signals.

12. A memory device according to claim 7, further comprising:

a plurality of split word line drivers disposed in row and column directions;

a plurality of primary sense amplifier blocks disposed in said row and column directions;

a plurality of redundant sense amplifier blocks disposed in said row and column directions, a respective one of said redundant sense amplifier blocks being disposed adjacent a respective one of said primary sense amplifier blocks in said row direction;

a plurality of primary global I/O lines extending in said column direction, overlying a first group of said split word line drivers and connected to said primary I/O sense amplifiers;

a plurality of redundant global I/O lines extending in said column direction, overlying a second group of said split word line drivers and connected to said redundant I/O sense amplifiers; and a plurality of primary sub I/O lines extending in said row direction, overlying said primary sense amplifier blocks, which are switchably connected to said primary global I/O lines and to primary memory cells in an adjacent primary memory cell array; and a plurality of redundant sub I/O lines extending in said row direction, overlying said redundant sense amplifier blocks, which are switchably connected to said redundant global I/O lines and to redundant memory cells in an adjacent redundant memory cell array; and wherein each block of primary memory cells is arranged as a plurality of primary memory cell arrays, a respective one said plurality of primary memory cell arrays being disposed between a respective pair of said split word line drivers in said row direction and between a respective pair of said sense amplifier blocks in said column direction; and wherein each block of redundant memory cells is arranged as a plurality of redundant memory cell arrays, a respective one of said redundant memory cell arrays being disposed between a respective one of said primary memory cell arrays and a respective one of said split word line drivers in said row direction and between a respective pair of said redundant sense amplifier blocks in said column direction.

* * * * *